United States Patent
Serrano et al.

(10) Patent No.: US 7,375,595 B2
(45) Date of Patent: May 20, 2008

(54) METHOD AND APPARATUS FOR CALIBRATING A PHASE LOCKED LOOP IN OPEN-LOOP

(75) Inventors: Louie Serrano, Irvine, CA (US); Alireza Zolfaghari, Irvine, CA (US); Paul Lettieri, Lake Forest, CA (US); Hea Joung Kim, Irvine, CA (US); Hooman Darabi, Irvine, CA (US); Henrik Jensen, Long Beach, CA (US); Behnam Mohammadi, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 36 days.

(21) Appl. No.: 11/540,878

(22) Filed: Sep. 29, 2006

(65) Prior Publication Data

US 2008/0079509 A1 Apr. 3, 2008

(51) Int. Cl.
*H03L 7/08* (2006.01)
*H03L 7/099* (2006.01)

(52) U.S. Cl. ............................. 331/44; 331/16; 331/17

(58) Field of Classification Search ............... 331/44, 331/16, 17
See application file for complete search history.

(56) References Cited

U.S. PATENT DOCUMENTS

| 6,998,922 B2* | 2/2006 | Jensen et al. ................. 331/17 |
| 2005/0073369 A1* | 4/2005 | Balboni et al. ............... 331/16 |
| 2005/0156676 A1* | 7/2005 | Wang et al. .................. 331/16 |
| 2006/0139105 A1* | 6/2006 | Maxim et al. ................ 331/16 |

* cited by examiner

*Primary Examiner*—Joseph Chang

(57) ABSTRACT

Methods and apparatus for calibrating a transitional loop, such as a phase locked loop, are disclosed. An example method includes performing an open loop calibration of a voltage controlled oscillator (VCO). The open loop calibration includes tuning the output oscillation frequency of the VCO to within a predetermined range of frequencies. The example method further includes determining a voltage offset and a gain error of an analog to digital converter (ADC) coupled with the phase locked loop. The example method also includes determining a gain offset of the open loop calibrated VCO using the voltage offset and the gain error of the ADC. In the example method, a signal provided by a charge pump of the PLL is adjusted based on the determined gain offset.

20 Claims, 7 Drawing Sheets

RF transmitter 80

Linearized Model of 80

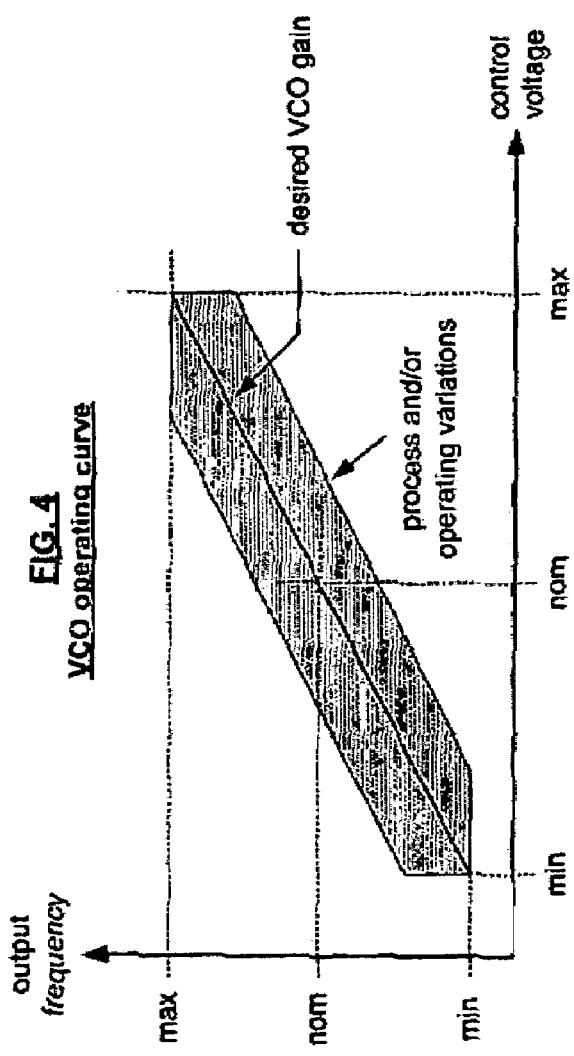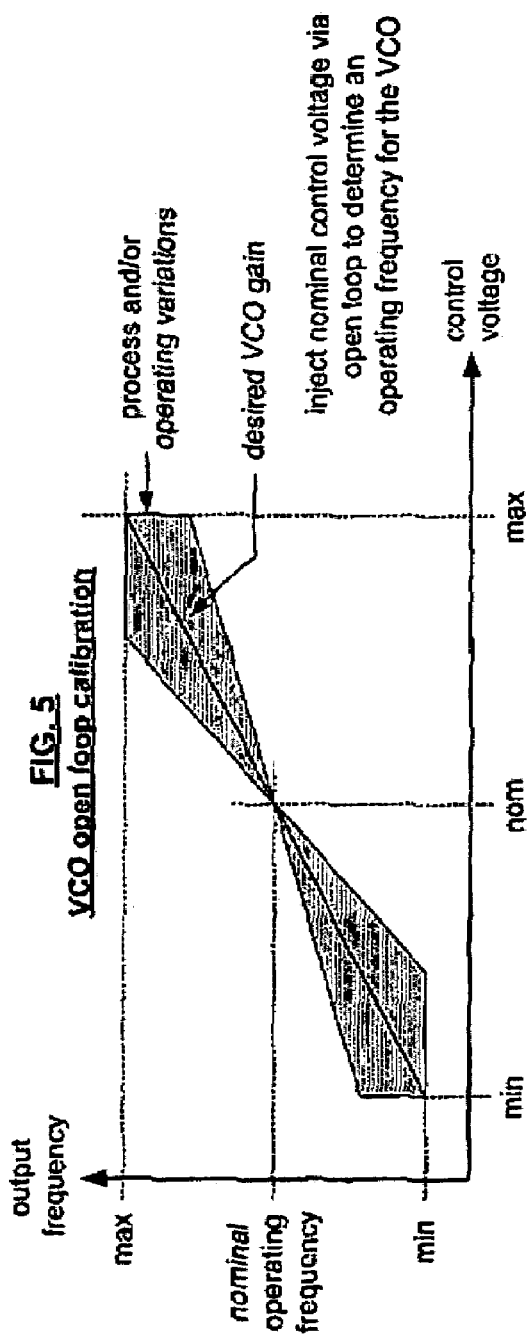

charge pump 102 and loop filter 104 effectively adjusted VCO gain

METHOD AND APPARATUS FOR CALIBRATING A PHASE LOCKED LOOP IN OPEN-LOOP

BACKGROUND

Communication systems that support wireless and/or wired communications between wireless and/or wire-line communication devices are being rapidly proliferated. Such communication systems range from national and/or international cellular telephone systems, to the Internet, to point-to-point in-home wireless networks. Each type of communication system is typically constructed to operate in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), and multi-channel-multi-point distribution systems (MMDS), among any number of other standards or combination of standards.

Depending on the type of wireless communication system, a wireless communication device, such as a cellular telephone, two-way radio, personal digital assistant (PDA), personal computer (PC), laptop computer, home entertainment equipment, as some examples, may communicate directly and/or indirectly with other wireless or wired communication devices. For direct communication (e.g., point-to-point communications), the participating wireless communication devices may tune their receivers and transmitters to the same channel or multiple channels (e.g., one or more of the plurality of radio frequency (RF) carriers of the wireless communication system) and communicate over that channel or channels. For indirect wireless communications, each wireless communication device may communicate directly with an associated base station (e.g., for cellular services) and/or an associated access point (e.g., for an in-home or in-building wireless networks) via an assigned channel, or channels. To complete a communication connection between the wireless communication devices, the associated base stations and/or associated access points may communicate with each other directly, via a system controller, via the public switch telephone network, via the internet, and/or via some other wide area network.

For wireless communication devices to participate in wireless communications, the devices may each include a built-in radio transceiver (e.g., receiver and transmitter) or may be coupled to an associated radio transceiver (e.g., a station for in-home and/or in-building wireless communication networks, RF modem, etc.). As is known, the receiver portion of such a transceiver may receive RF signals, demodulate an RF carrier frequency from the RF signals via one or more intermediate frequency stages to produce baseband signals, and demodulate a baseband signal in accordance with a particular wireless communication standard to recapture transmitted data from an intermediate frequency signal. The transmitter portion of such a transceiver may convert data (e.g., digital data) into RF signals by modulating the data in accordance with a particular wireless communication standard to produce baseband signals and mix the baseband signals with an RF carrier using one or more intermediate frequency stages to produce RF signals. In other embodiments, transmitted and received signals may be directly converted between the RF domain and baseband.

Phase locked loops (PLL) are often used in integrated wireless transceivers for RF frequency generation and RF signal modulation due to their high level of integration and ability to operate over a wide range of frequencies. As those working in this area are aware, two basic PLL topologies exist, which are generally referred to as "type 1" and "type 2," respectively. A general structure is common to both types of PLLs, namely each topology includes a phase detector, a low-pass filter (LPF), a voltage controlled oscillator (VCO), and a feedback path. The phase detector serves as an "error amplifier" in the feedback loop. Based on an "error" signal produced by the phase detector, the PLL may reduce any phase difference between the input reference signal and the feedback signal (e.g., "the error"). A PLL is considered "locked" if this phase difference is constant over time.

In "type 1" PLLs, the phase detector generates square voltage pulses whose duration is proportional to the phase error. These voltage pulses are filtered by the LPF to generate a smooth VCO control voltage whose amplitude is proportional to the phase error. The VCO responds to the change in control voltage by increasing or decreasing its oscillation frequency. The feedback action of the PLL then causes the VCO to lock to the desired operating frequency.

"Type 2" PLLs, also known as "charge pump based PLLs," include a phase and frequency detector, a charge pump, a loop filter, a voltage controlled oscillator (VCO), and a feedback path. The phase and frequency detector compares the phase and frequency of a reference signal with the phase and frequency of a feedback signal (e.g., the output oscillation produced by the VCO, which is fed back to the phase and frequency detector via the feedback loop). If the phase and/or frequency of the reference signal leads the phase and/or frequency of the feedback signal (which occurs when the output oscillation frequency is less than the desired oscillation frequency), the phase and frequency detector generates an up signal. In response to the up signal, the charge pump increases the positive current it outputs, which, when filtered by the loop filter, increases a control voltage applied to an input of the VCO. With an increase in the control voltage, the VCO increases its frequency of oscillation. If the phase and/or frequency of the reference signal lags the phase and/or frequency of the feedback signal (which occurs when the output oscillation frequency is greater than the desired oscillation frequency), the phase and frequency detector generates a down signal. In response to the down signal, the charge pump increases the negative current it outputs, which, when filtered by the loop filter, decreases the control voltage input to the VCO. With a decrease of the control voltage, the VCO decreases its frequency of oscillation.

In an "ideal" PLL (e.g., in a mathematical model of a PLL), the VCO operates linearly, which can be expressed as: $\Theta_{out}(t) = K_{VCO} \int V_{cntrl}(t) dt$, where $K_{VCO}$ is the gain (specified in MHz/volt, for example) of the VCO, $\Theta_{out}$ is the output oscillation of the VCO, and $V_{cntrl}$ is the input control voltage of the VCO provided by the loop filter. Based on this mathematical model of PLL operation, when a PLL settles to a desired output frequency (i.e., the output signal frequency of the VCO), the input control voltage of the VCO assumes a constant value. When the PLL is used as a modulator, the control voltage may vary around this constant value in accordance with a desired modulation pattern, thus providing frequency modulation.

It follows from the above equation that the frequency of a modulated signal produced using a PLL operating in accordance with the mathematical model is proportional to the change in control voltage with a proportionality constant equal to $K_{VCO}$. In practice, however, the gain of a VCO (i.e., $K_{VCO}$) is not constant, but varies with integrated circuit fabrication process, PLL frequency band, control voltage amplitude, and temperature, among any number of other parameters. For instance, for a PLL that has a wide frequency range of operation, the gain of the VCO may vary from its nominal design value by as much as +/−50%. Since $K_{VCO}$ is a key parameter governing the dynamic behavior of the PLL, when used as a data signal modulator (e.g., in a translational loop), such large variations in VCO gain may produce prohibitively large modulation errors.

One possible solution to reduce the adverse affects of such variations in VCO gain is to design a baseband processor that is used in conjunction with the PLL to account for VCO gain variations. This approach, however, relies on an assumed VCO gain variation. Therefore, such an approach may not be particularly precise, making this solution of limited benefit.

SUMMARY

The following embodiments and aspects thereof are described and illustrated in conjunction with systems, tools and methods which are given by way of example and meant to be illustrative, not/limiting in scope. In various embodiments, one or more of the above-described problems have been reduced or eliminated, while other embodiments are directed to other improvements.

In an example embodiment, a method for calibrating a PLL includes performing an open loop calibration of a voltage controlled oscillator (VCO). The open loop calibration includes tuning the output oscillation frequency of the VCO to within a predetermined range of frequencies. The example method further includes determining a voltage offset and a gain error of an analog to digital converter (ADC) coupled with the phase locked loop. The example method also includes determining a gain offset of the open loop calibrated VCO using the voltage offset and the gain error of the ADC. In the example method, a signal provided by a charge pump of the PLL is adjusted based on the determined gain offset.

In another example embodiment, a PLL that is adapted for auto-calibration includes a phase and frequency detection module, that is adapted to produce an up signal when at least one of a phase and a frequency of a reference oscillation leads at least one of a phase and a frequency of a feedback oscillation. The phase and frequency detection module is also adapted to produce a down signal when the at least one of the phase and the frequency of the feedback oscillation leads' the at least one of the phase and the frequency of the reference oscillation.

The example apparatus also includes a charge pump that is adapted to receive the up signal and the down signal and provide a charge pump signal in response to the received up signal or down signal. The example apparatus further includes a loop filter that is adapted to receive the charge pump signal and provide a control voltage in response to the received charge pump signal. The example apparatus still further includes a voltage controlled oscillator (VCO) that is adapted to receive the control voltage and provide an output oscillation signal in response to the received control voltage.

The example embodiment also includes a calibration module that is adapted to perform an open loop calibration of the VCO during which the frequency of the output oscillation signal from the VCO is tuned within a predetermined range of frequencies. The calibration module is also adapted to determine a voltage offset and a gain error of an analog to digital converter (ADC) included in the calibration module, where the ADC is coupled (e.g., selectively coupled) with the PLL. The calibration module is still further adapted to determine a gain offset of the open loop calibrated VCO using the voltage offset and the gain error of the ADC and adjust the charge pump signal based on the determined gain offset.

BRIEF DESCRIPTION OF THE DRAWINGS

Example embodiments are illustrated in referenced figures of the drawings. It is intended that the embodiments and figures disclosed herein are to be considered illustrative rather than restrictive.

FIG. 4 is a graph depicting a range of possible gain variations of a voltage controlled oscillator (VCO).

FIG. 5 is a graph illustrating an example open-loop PLL/VCO calibration technique.

DETAILED DESCRIPTION

Example Communication System

Figure 1:
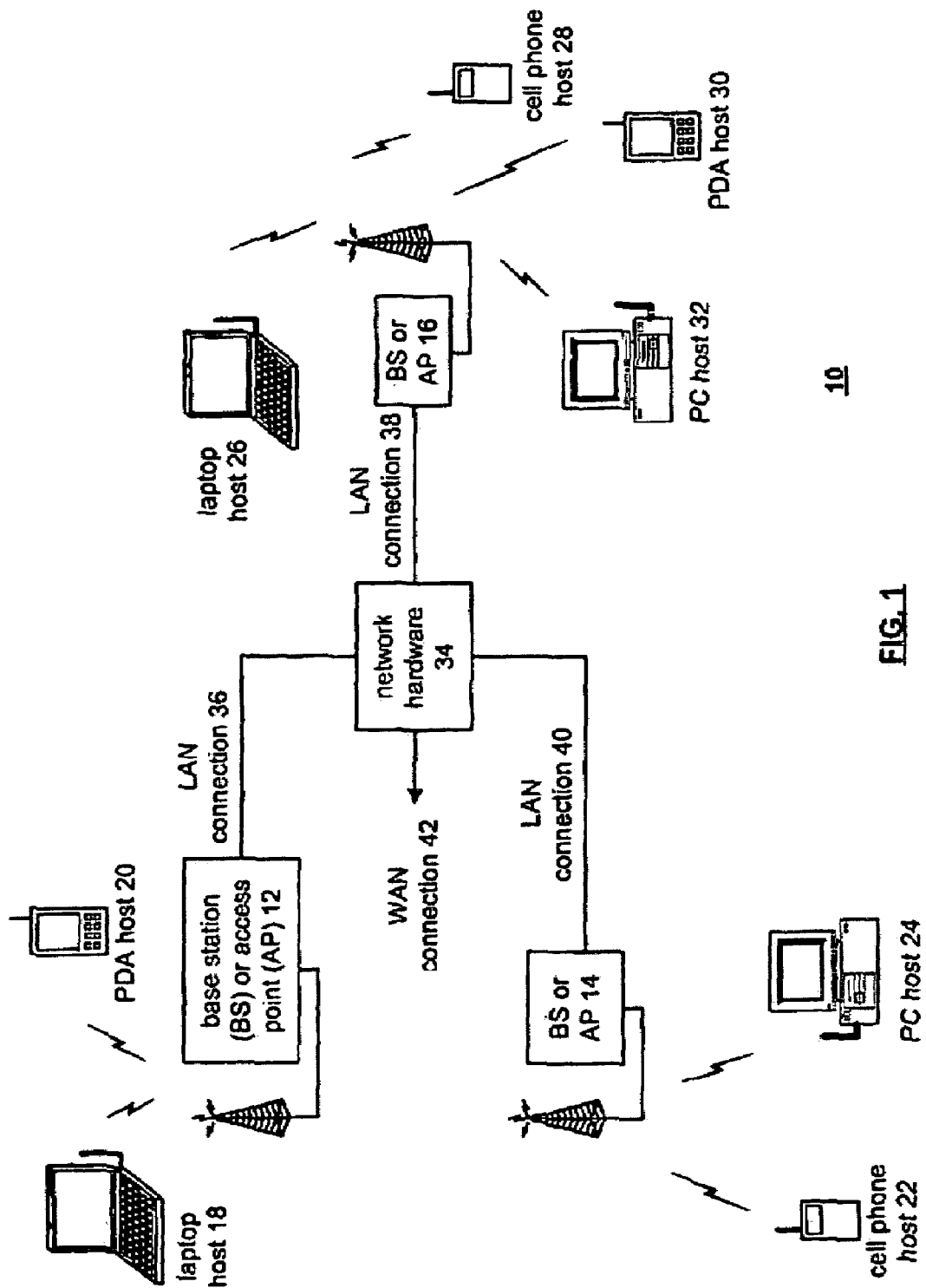
FIG. 1 is a schematic block diagram of an example wireless communication system.

FIG. 1 is a schematic block diagram illustrating an example communication system 10 that includes a plurality of base stations and/or access points 12-16, a plurality of wireless communication devices 18-32 and a network hardware component 34. The wireless communication devices 18-32 may be laptop computer hosts 18 and 26, personal digital assistant hosts 20 and 30, personal computer hosts 24 and 32 and/or cellular telephone hosts 22 and 28. Of course, any number of other types of wireless device may also be included in such a system. Additional details of an example wireless communication device will be described below with reference to FIG. 2.

In the system 10, the base stations or access points 12-16 are operably coupled to the network hardware component 34 via local area network connections 36, 38, and 40. The network hardware component 34, which may be a router, switch, bridge, modem, system controller, or any other appropriate device, for this embodiment, provides a wide area network connection 42 for the communication system 10. Each of the base stations or access points 12-16 may have an associated antenna or antenna array to communicate with the wireless communication devices in its geographic area. Typically, the wireless communication devices may register with a particular base station or access point (e.g., base station or access point 12 or 14) to receive services from the communication system 10. For direct connections (e.g., point-to-point communications), wireless communication devices may communicate directly with each other (rather than via an access point) using an allocated communication channel or channels on the respective devices.

Typically, base stations are used for cellular telephone systems and similar systems, while access points are used for in-home or in-building wireless networks. Regardless of the particular type of communication system, each wireless communication device may include a built-in radio and/or be operably coupled to an external radio device. Such radios may include highly linear amplifiers and/or programmable multi-stage amplifiers.

Example Wireless Communication Device.

Figure 2:
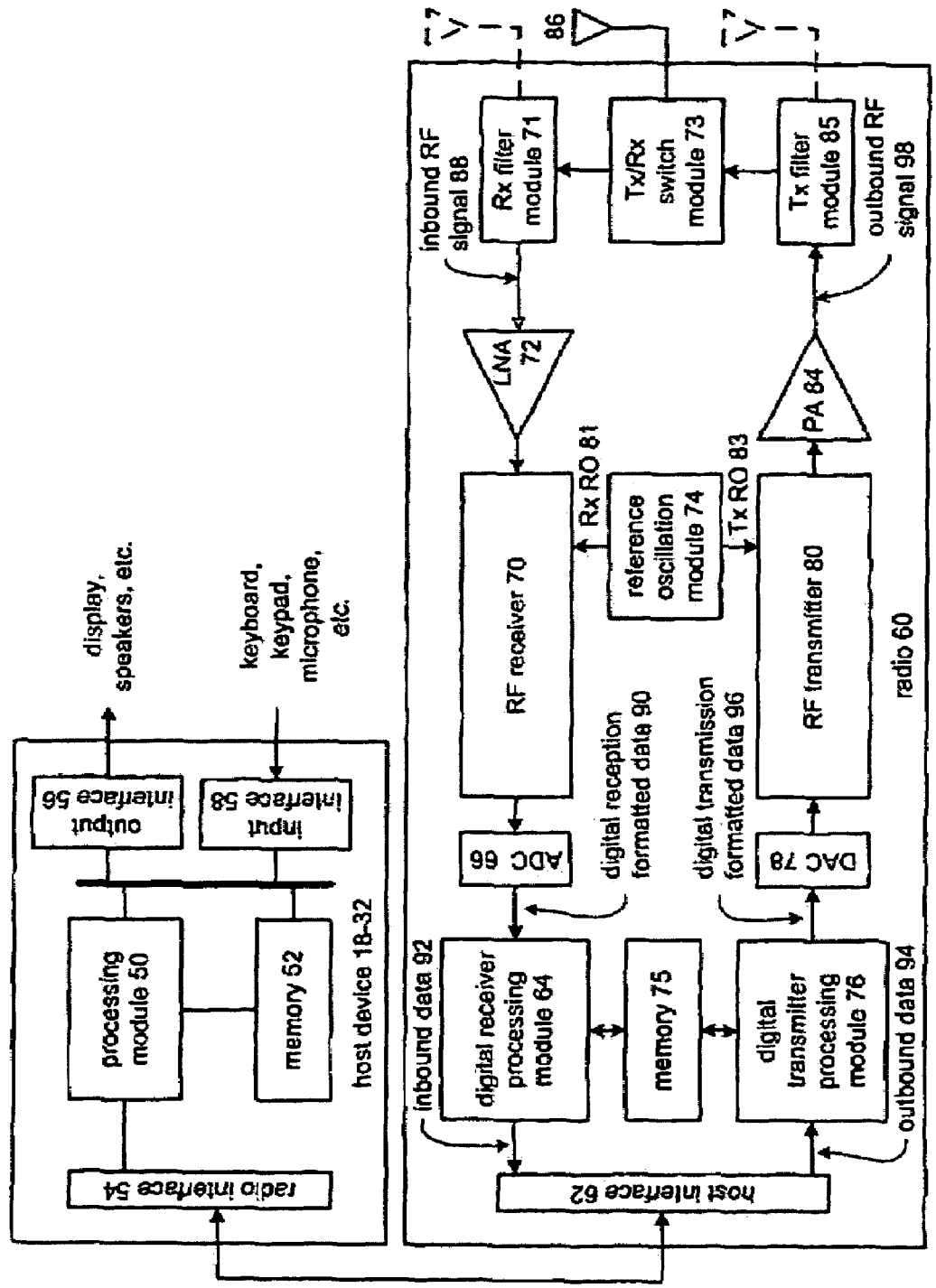
FIG. 2 is a schematic block diagram of an example wireless communication device that may be used in the system of FIG. 1.

FIG. 2 is a schematic block diagram illustrating an example wireless communication device that includes a host device 18-32 (shown in FIG. 1) and an associated radio 60. For cellular telephone hosts, the radio 60 is generally a built-in component. For personal digital assistants hosts, laptop hosts, and/or personal computer hosts, the radio 60 may be built-in or may be an external component.

In FIG. 2, the host device 18-32 includes a processing module 50, a memory 52, a radio interface 54, an input interface 58, and an output interface 56. The processing module 50 and the memory 52 may execute instructions (e.g., service logic implemented in software, hardware and/or firmware) to implement various functions of the host device 18-32. For example, for a cellular telephone host device, the processing module 50 may execute instructions that implement communication functions in accordance with a particular cellular telephone standard.

The radio interface 54 of the host device 18-32 may allow for data to be received from and sent to the radio 60. For data received from the radio 60 (e.g., inbound data), the radio interface 54 may provide the data to the processing module 50 for further processing and/or routing to the output interface 56. The output interface 56 may further provide connectivity to an output display device such as a monitor, speakers, or other appropriate device, such that the received data may be provided to a user of the host device 18-32.

The radio interface 54 also may provide data from the processing module 50 to the radio 60. The processing module 50 may receive the outbound data from an input device such as a keyboard, keypad, microphone, or other input device via the input interface 58. Alternatively, the processing module 50, itself, may generate data that is provided to the radio 60 via the radio interface 54. For data received via the input interface 58, the processing module 50 may perform a corresponding host function on the data and/or route the received data to the radio 60 via the radio interface 54.

Radio 60 includes a host interface 62, a digital receiver processing module 64, an analog-to-digital converter 66, an RF receiver section 70 that may include a filtering/gain module and an IF down-conversion mixing stage, a receiver filter 71, a low noise amplifier 72, a transmitter/receiver (Tx/Rx) switch 73, a local oscillation module 74, a memory 75, a digital transmitter processing module 76, a digital-to-analog converter 78, a transmitter section 80 that may include a filtering/gain module and an IF up-conversion mixing stage, a power amplifier 84, a transmitter filter module 85, and an antenna 86. The antenna 86 may be a single antenna that is shared by the transmit path and receive path and is regulated by the Tx/Rx switch 73, or may include separate antennas for the transmit path and receive path. The particular antenna implementation may depend, at least in part, on the standard(s) with which the wireless communication device is compliant.

The digital receiver processing module 64 and the digital transmitter processing module 76 (in combination with operational instructions (e.g., service logic) that may be stored in memory 75) may execute digital receiver functions and digital transmitter functions, respectively. The digital receiver functions may include, but are not limited to, digital intermediate frequency to baseband conversion, demodulation, constellation demapping, decoding, and/or descrambling. The digital transmitter functions may include, but are not limited to, scrambling, encoding, constellation mapping, modulation, and/or digital baseband to IF conversion.

Depending on the particular embodiment, the digital receiver and transmitter processing modules 64 and 76 may be implemented using a shared processing device, individual processing devices, or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

The memory 75 may be a single memory device or a plurality of memory devices. Such a memory device may be a read-only memory, random access memory, volatile memory, non-volatile memory, static memory, dynamic memory, flash memory, and/or any device that stores digital information. It is noted that when the processing module 64 and/or 76 implements one or more of its functions using, for example, a state machine, analog circuitry, digital circuitry, and/or logic circuitry, a memory storing the corresponding operational instructions may be embedded (e.g., integrated) with the circuitry comprising the state machine, analog circuitry, digital circuitry, and/or logic circuitry.

In operation, the radio 60 may receive outbound data 94 from the host device 18-32 via the host interface 62. The host interface 62 in FIG. 2 routes the outbound data 94 to the digital transmitter processing module 76, which may then process the outbound data 94 in accordance with a particular wireless communication standard (e.g., IEEE 802.11, Bluetooth, etc.) to produce digital transmission formatted data 96. The digital transmission formatted data 96 may be a digital base-band signal or a digital low-IF signal, where the low-IF typically may be in the frequency range of one hundred kilohertz to a few megahertz.

Figure 3:
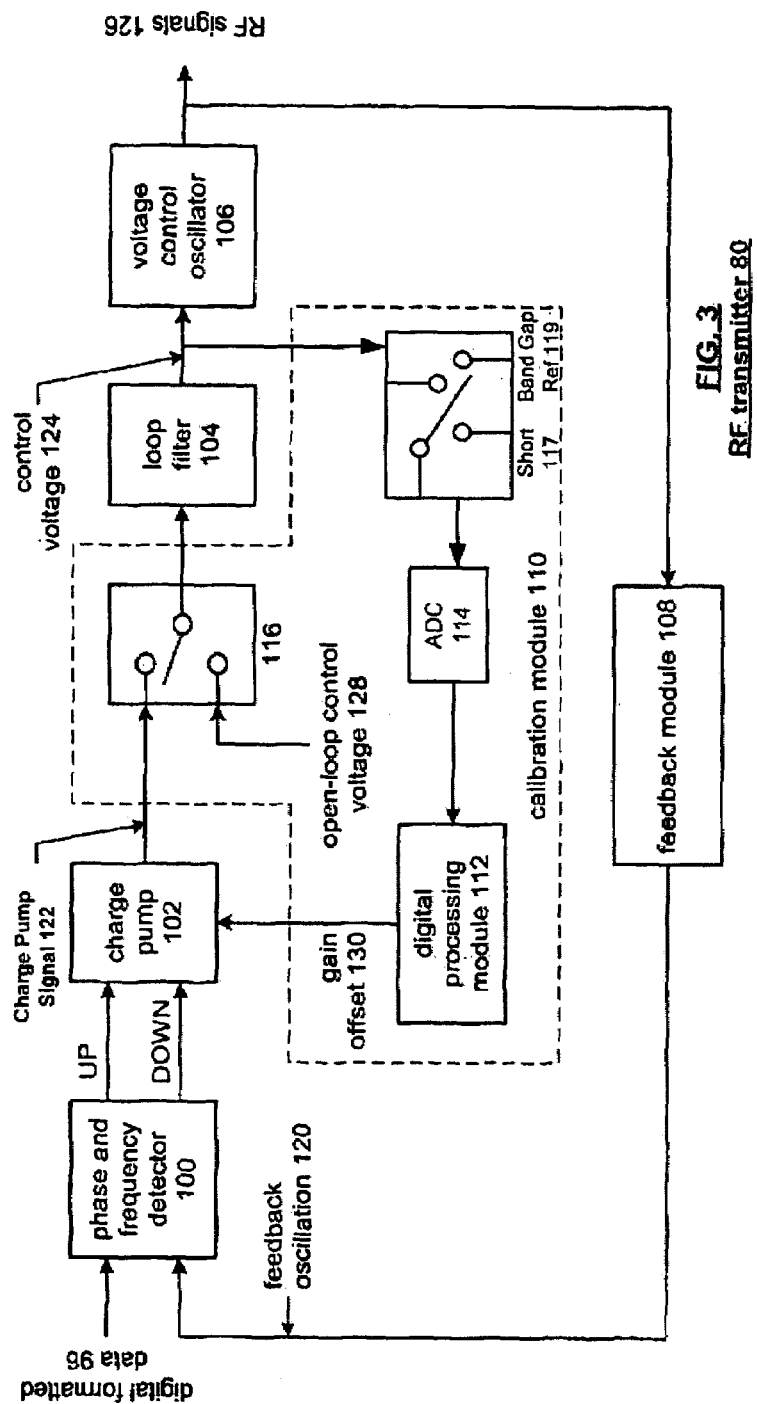
FIG. 3 is a schematic block diagram of an example radio frequency translational loop (PLL) transmitter that may be implemented in the device of FIG. 2.

The digital-to-analog converter 78 may convert the digital transmission formatted data 96 from the digital domain to the analog domain. A filtering/gain module of the transmitter section 80 may filter and/or adjust the gain of the analog signal prior to providing it to an IF mixing stage of the transmitter section 80. The IF mixing stage may convert the analog baseband or low IF signal into an RF signal based on a transmitter local oscillation 83 provided by the local oscillation module 74, which may include a phase locked loop as shown in FIG. 3. The power amplifier 84 may amplify the RF signal to produce an outbound RF signal 98, which may then be filtered by the transmitter filter module 85. The antenna 86 may then transmit the outbound RF signal 98 to a targeted device such as a base station, an access point and/or another wireless communication device.

The radio 60 may also receive an inbound RF signal 88 via the antenna 86, where the inbound RF signal 88 was transmitted by a base station, an access point, or another wireless communication device. The antenna 86 may provide the inbound RF signal 88 to the receiver filter module 71 via the Tx/Rx switch 73. The Rx filter 71 may bandpass filter the inbound RF signal 88 to isolate a specific range of frequencies, where the range of frequencies corresponds with a selected channel for a given communication protocol.

The Rx filter 71 may then provide the filtered RF signal to the low noise amplifier 72, which may amplify the filtered signal to produce an amplified inbound RF signal. The low noise amplifier 72 may then provide the amplified inbound RF signal to an IF mixing module (down-conversion module) of the receiver section 70, which may directly convert the amplified inbound RF signal into an inbound low IF signal or baseband signal based on a receiver local oscillation 81 provided by the local oscillation module 74. As discussed above, the local oscillation module may include a phase locked loop, such as shown in FIG. 3.

The down conversion module of the receiver section 70 may then provide the inbound low IF signal or baseband signal to the filtering/gain module 68. The filtering/gain module 68 may filter and/or amplify the inbound low IF signal or the inbound baseband signal to produce a filtered inbound and/or amplified signal.

The analog-to-digital converter 66 may then convert the filtered inbound signal from the analog domain to the digital domain to produce digital reception formatted data 90. The digital receiver processing module 64 may then decode, descramble, demap, and/or demodulate the digital reception formatted data 90 to recapture inbound data 92 in accordance with a particular wireless communication standard being implemented by radio 60. The host interface 62 may then provide the recaptured inbound data 92 to the host device 18 32 via the radio interface 54.

As those working in this area will understand, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60 (e.g., other than the antenna 86), may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Phase Locked Loop with Calibration Module

FIG. 3 is a schematic block diagram of an analog portion of a transmitter that may be implemented in the transmitter section 80 of the wireless communication device illustrated in FIG. 2. In such an embodiment, the transmitter 80 may be implemented as a translational loop (e.g., PLL) for modulating frequency shift keying ("FSK"), phase shift keying ("PSK"), and/or magnitude shift keying ("MSK") data 96 into RF signals 126 that are subsequently amplified via the power amplifier 84 and transmitted via the antenna 86. The particular type of data modulation (e.g., FSK, PSK, and MSK) and the frequency of the RF signals (900 MHz, 1.8 GHz, 2.4 GHz, etc.) are dictated, at least in part, by the particular standard or standards to which the radio conforms. For example, the standard may be GSM, Bluetooth, etc.

Figure 3A:
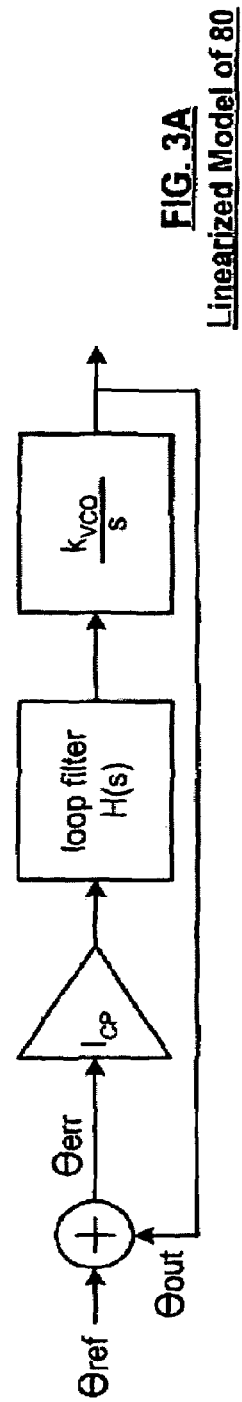
FIG. 3A is a linearized model of the RF translational loop transmitter shown in FIG. 3.

The translational loop (i.e., the PLL) includes a phase and frequency detector 100, a charge pump 102, a loop filter 104, a voltage controlled oscillator 106, a feedback module 108, and a calibration module 110. The calibration module 110 includes a digital processing module 112, an analog to digital converter ("ADC") 114, a first switch mechanism 116 and a second switch mechanism 118. In general, when the gain of the VCO 106 (i.e., $K_{VCO}$) changes, it affects the overall loop performance as can be readily seen from the linearized model of the transmitter 80 shown in FIG. 3A. By introducing an approximately equal but opposite change into the loop, variations in the VCO gain may be substantially corrected/compensated for. As may be inferred from the linearized model of the transmitter 80, such a correction/compensation may be introduced at any number of points in the transitional loop. As is described in further detail below, such correction/compensation may, for example, be implemented by the charge pump 102. It will be appreciated the that components of the PLL and calibration module 110 may be differential components and, accordingly, comprise first (non-inverting) input and output terminals and second (inverting) input and output terminals.

Returning to the discussion of FIG. 3, in normal operation of the PLL (i.e., when the PLL is not in calibration mode), the phase and frequency detector 100 compares the phase and/or frequency differences of the digital modulated data 96 and a feedback oscillation 120. Based on these differences, the phase and frequency detector 100 generates an up signal and/or a down signal. The up signal causes the charge pump 102 to source a larger amount of current to the loop filter 104 (e.g., provide more positive current pulses) and the down signal causes the charge pump 102 to sink more current from the loop filter 104 (e.g., provide more negative current pulses). As such, the current signal 122 produced by the charge pump 102 either sources current to or sinks current from the loop filter 104 via the switch 116. The loop filter 104 translates the current signal 122 (e.g., charge pump signal) from the charge pump 102 into a control voltage 124. The VCO 106 then translates the control voltage 124 into an RF signal 126 based on the gain of the VCO ($K_{VCO}$). The feedback module 108 produces the feedback oscillation 120 by dividing the RF signal 126 using a divider value, which may be an integer or a whole number. Such signal division techniques are known and are not described in detail here.

To reduce distortions in the RF signals 126 that may be caused by variations in the VCO gain, the calibration module 110 may calibrate the translational loop prior to the transmission of each packet of data, prior to the transmission of each data frame, or as often as desired or recommended for a particular embodiment. To calibrate the loop, the calibration module 110 may open the loop using the first switch device 116 and inject an open-loop control voltage 128 into the loop filter 104.

For instance, the open-loop voltage 128 may be a nominal voltage corresponding to a nominal VCO gain (e.g., the mathematical model nominal gain value) of the VCO 106. With reference to FIG. 4, the gain of the VCO 106 is represented by a curve of output frequency versus the control voltage. In FIG. 4, the nominal VCO gain is shown by the solid line. This nominal VCO gain curve corresponds to producing a nominal output frequency at a nominal control voltage. However, as also shown in FIG. 4, the actual gain may vary significantly from the nominal gain, as is illustrated by the shaded area.

For the PLL mathematical model, the nominal control voltage may be half way between a minimum control voltage and a maximum control voltage for the VCO. Such a nominal control voltage may produce a VCO oscillation at a nominal output frequency, which can be half way between the minimum output frequency and the maximum output frequency of the VCO. Further, in the mathematical model, the output oscillation frequency of the VCO increases linearly from the minimum output frequency to the maximum output frequency as the control voltage varies from the minimum control voltage to the maximum control voltage. Accordingly, the open-loop voltage 128 may be selected to correspond to the mathematical model's nominal control voltage even though the actual nominal voltage (e.g., the control voltage producing the nominal output frequency) for a particular PLL may vary significantly from the mathematical model's nominal control voltage.

Returning to the discussion of FIG. 3, with the nominal control voltage (the open loop control voltage 128) applied to the input of the VCO 106 via the switch device 116 and the loop filter 104, the output frequency of the VCO 106 may be "coarse tuned" to an oscillation frequency that is, for example, within a certain percentage of the desired nominal output frequency. For instance, a counter may be used to determine the number of oscillations in a given period of time. Based on this count, a capacitance of the VCO may be changed to either increase or decrease the oscillation frequency of the VCO using a bank of weighted tuning capacitors. This coarse tuning may be accomplished using a binary search approach.

FIG. 5 is a graph illustrating an example open-loop PLL/VCO calibration technique and depicts, for a given VCO, the nominal operating frequency for the nominal control voltage. From this information, the capacitance of the VCO may be adjusted to coarse tune the actual nominal output frequency to be substantially equal the mathematical model's nominal output frequency (e.g., within a certain percentage). As an alternative to changing the capacitance of the VCO 106, such an adjustment may be made by offsetting the control voltage provided by the loop filter 104, by adjusting the current sourced and/or sunk by the charge pump 102, or by adjusting the up and down signals produced by the phase and frequency detector 100. As yet another alternative, the actual output frequency of the VCO at the nominal control voltage (open loop control voltage 128) may not be adjusted and merely used as a reference point for closed loop calibration, which will be described below.

The calibration module 110 may also perform a calibration of the ADC 114 during a period of time during which open loop calibration is being performed to coarse tune the VCO 106, as discussed above. The ADC calibration, which may be controlled by the digital processing module 112 (e.g., operating as a sequencer) may include determining a voltage offset, $V_{offset}$, of the ADC 114 and determining a gain error, $V_{gain}$, of the ADC 114.

$V_{offset}$ may be determined by shorting the differential input terminals of the ADC 114 together using second switch device 118. The terminals may also be shorted to a known short reference 117, such as electrical ground. The output of the ADC 114 (e.g., after a settling period) is then measured and stored in the digital processing module 112 as $V_{offset}$.

$V_{gain}$ may be determined by; applying a known reference voltage, $V_{ref}$ (such as a reference voltage provided by a bandgap reference circuit or other stable voltage bias generator circuit) across the output terminals of the ADC 114. After a settling period, the output of the ADC 114 may be measured and stored in the digital processing module as $V_{gain}$.

Once $V_{offset}$ and $V_{gain}$ are determined by the calibration module 110, subsequent measurements made using the ADC (such as control voltages measured during closed loop calibration, as discussed below) may be adjusted by the digital processing module 112 using the following equations, where an adjusted value is given by $V_{ADC}$, and $V_{ADC} = (V_{meas}/\alpha) - V_{offset}$, where $V_{meas}$ is the measured output voltage of the ADC 114 and $\alpha = V_{gain}/V_{ref}$. Once the open loop and ADC calibrations are complete, the sequencer (e.g., digital processing module 112) may close the loop using the first switch device 116 and may couple the ADC 114 with the loop filter 106 and the VCO 106 using the second switch device 118.

Closed loop calibration of the PLL may then be performed. For instance, as was just discussed, using the first switch device 116, the transitional loop (PLL) may be closed (e.g., when the switch 116 couples the charge pump 102 to the loop filter 104) and the second switch device 118 may be used to couple the ADC 114 to the output terminal(s) of the loop filter 104 and the input terminal(s) of the VCO 106. A reference oscillation signal corresponding with the nominal operating frequency may then be applied to the loop. The digital processing module 112 may then wait a period of time for the loop to settle. After the settling period has expired, the digital processing module 112 may direct the ADC 114 to measure a first control voltage corresponding with the nominal operating frequency. Measurement of the first control voltage may be performed by the ADC 114 and this measurement adjusted by the digital processing module 112 using the voltage offset and the gain error of the ADC in the equations described above.

After measuring the first control voltage, a first frequency offset may be injected into the loop. Such a frequency offset may be introduced by injecting a frequency step in the feedback loop (e.g., using feedback module 108) or a phase ramp in the feed-forward path. After waiting again for the loop to settle, the digital processing module may direct the ADC to measure a second control voltage, which may be adjusted by the digital processing module 112 in the fashion described above.

Figure 6:
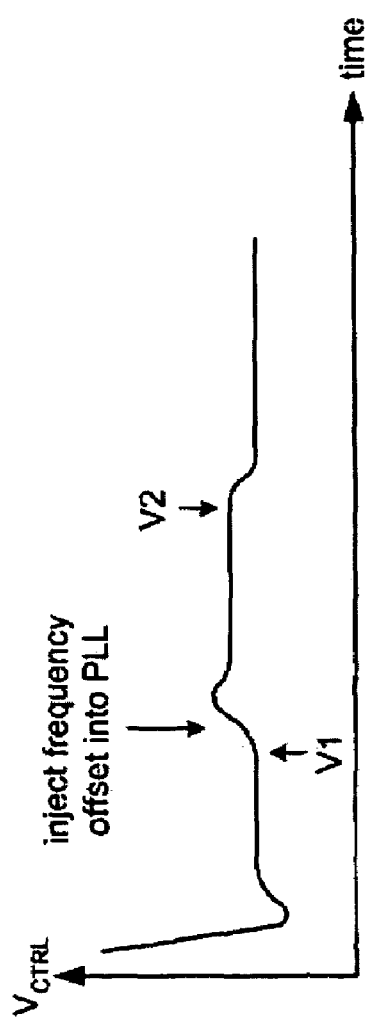
FIGS. 6 and 7 are graphs illustrating closed-loop PLL/VCO calibration techniques.

FIG. 6 is a graph illustrating closed-loop PLL/VCO calibration techniques and shows the effects of introducing a frequency shift on the control voltage. For instance, in the graph shown in FIG. 6, V1 corresponds with the first control voltage (for the reference frequency) and V2 represents the control voltage after the injection of the frequency offset and settling of the loop.

By injecting a known frequency offset and measuring the second control voltage V2, two points on the curve of the VCO gain may be obtained (e.g., the first point corresponds to the first control voltage for the reference oscillation and the second point corresponds to the second control voltage for the reference oscillation with the first frequency offset injected). From these two points, the actual gain of the VCO may be readily obtained by the equation: $K_{VCO} = \Delta f/(V2-V1)$, where $\Delta f$ represents the frequency offset. By empirically determining the VCO gain in this fashion, the operation of the transitional loop (PLL) 80 can be adjusted to more closely match a desired (nominal) VCO gain.

Figure 7:
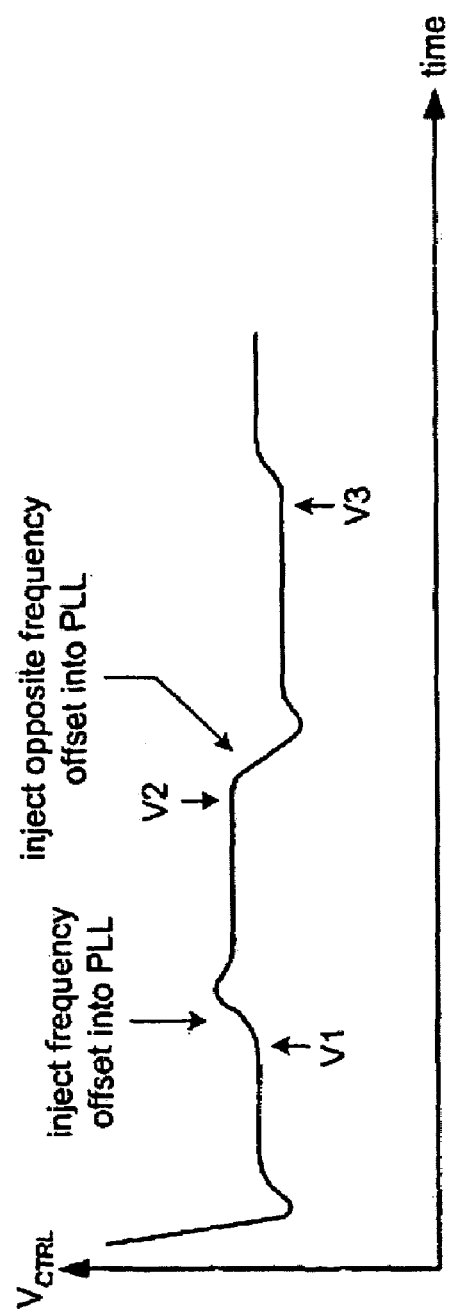

FIG. 7 also is a graph illustrating closed-loop PLL/VCO calibration techniques and shows the effects on the control voltages of a VCO when two frequency offsets are injected into the loop. V1 and V2 are shown in FIG. 7 temporal points that correspond to the same temporal points at which V1 and V2 are illustrated in FIG. 6. V3 corresponds with a third control voltage, which may be a control voltage that is measured after injecting a second (e.g., negative) frequency offset and waiting for the loop to settle. From these three points, an average empirical VCO gain may be obtained using the equation: $K_{VCO}=F1(V2-V1)+F2/(V1-V3)$, where F1 is the first frequency offset, F2 is the second frequency offset and V1, V2 and V3 are the control voltages described above. Using the average VCO gain, $K_{VCO}$, as determined by the above equation, the frequency of operation of the PLL, $F_{VCO}$, for a given control voltage, $V_{cntrl}$, may be determined by the equation: $F_{VCO}=F_{ol}+(K_{VCO}*V_{delta})$, where $F_{ol}$ is the oscillation frequency at the nominal control voltage after closing the loop subsequent to open loop and ADC calibration, as discussed above and $V_{delta}=V_{cntrl}-V_{bias}$, where $V_{bias}$ is the bias voltage of the VCO (e.g., approximately half the operating power supply voltage of the VCO).

Figure 8:
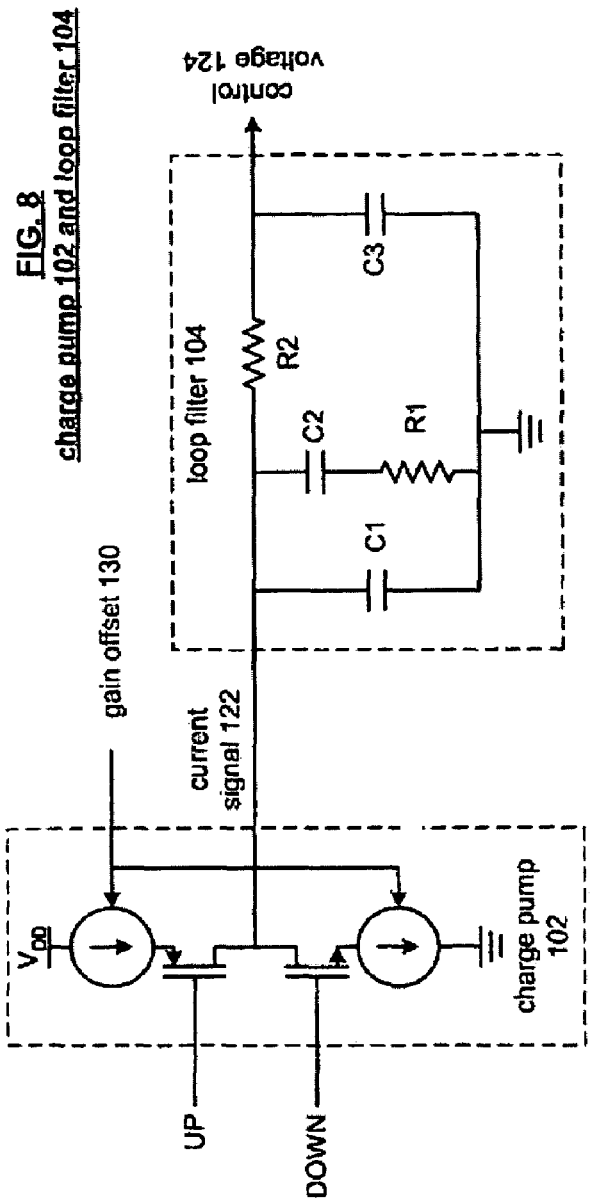
FIG. 8 is a schematic block diagram of an example charge pump circuit and loop filter of that may be implemented in the circuit of FIG. 3.
Figure 9:
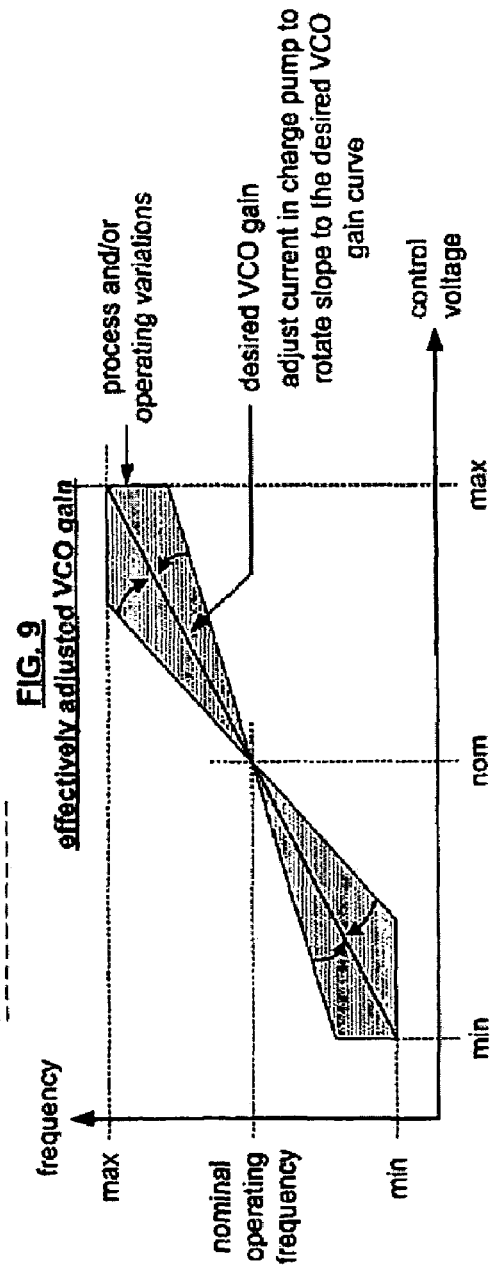
FIG. 9 is a graph illustrating an example VCO gain calibration technique.

As shown in FIG. 9 and with further reference to FIG. 3, the actual VCO gain of a given VCO 106 may fall somewhere in the shaded area. By adjusting the current sourced and/or sunk by the charge pump 102, as will be described with reference to FIG. 8, the VCO gain, on a transmission by transmission basis, may be adjusted to the desired VCO gain curve such that distortions in RF signals 126 produced by the PLL that are caused by variations of the VCO gain are substantially reduced or eliminated.

Returning to the discussion of the FIG. 3, having empirically determined the VCO gain, the digital processing module 112 may generate a gain offset 130 that is used to adjust the current sourced and/or sunk by the charge pump 102 to achieve the desired VCO gain as shown in FIG. 9. With the current of the charge pump 102 adjusted, the function of the loop shown in FIG. 3 is that of a basic PLL, where the VCO 106 converts the control voltage 124 into the RF signals 126 and the control voltage 124 is maintained at the desired level via the feedback module 108, the phase and frequency detector 100, and the adjusted charge pump 102.

FIG. 8 is a schematic block diagram of example embodiments of the charge pump 102 and the loop filter 104. In this example, the charge pump 102 includes enabling transistors and two dependent current sources. The loop filter 104 includes three capacitors C1 and C3 and two resistors R1 and R2. In operation, the upper current source sources a current to the loop filter 104 when the up signal is low and the low current source sinks a current from the loop filter 104 when the down signal is high. The amount of current sourced and/or sunk by the dependent current sources is established by the gain offset signal 130, which may individually set the current levels of the current sources or collectively set the level of the current sources.

The loop filter 104, via the capacitors C1 and C3, stores a charge based on the current signal 122 to produce the control voltage 124. Thus, the current signal 122 directly corresponds to the control voltage 124. Accordingly, by controlling (e.g., adjusting) the current sourced and/or sunk by the charge pump 102, the control voltage 124 is likewise controlled, which, in turn, adjusts the gain of the VCO. For example, if the gain of the VCO needs to be increased (e.g., increase the slope of the VCO gain curve) the current sourced by the charge pump may be increased. Alternatively, if the gain of the VCO needs to be decreased, the current sunk by the charge pump may be increased.

Figure 10:
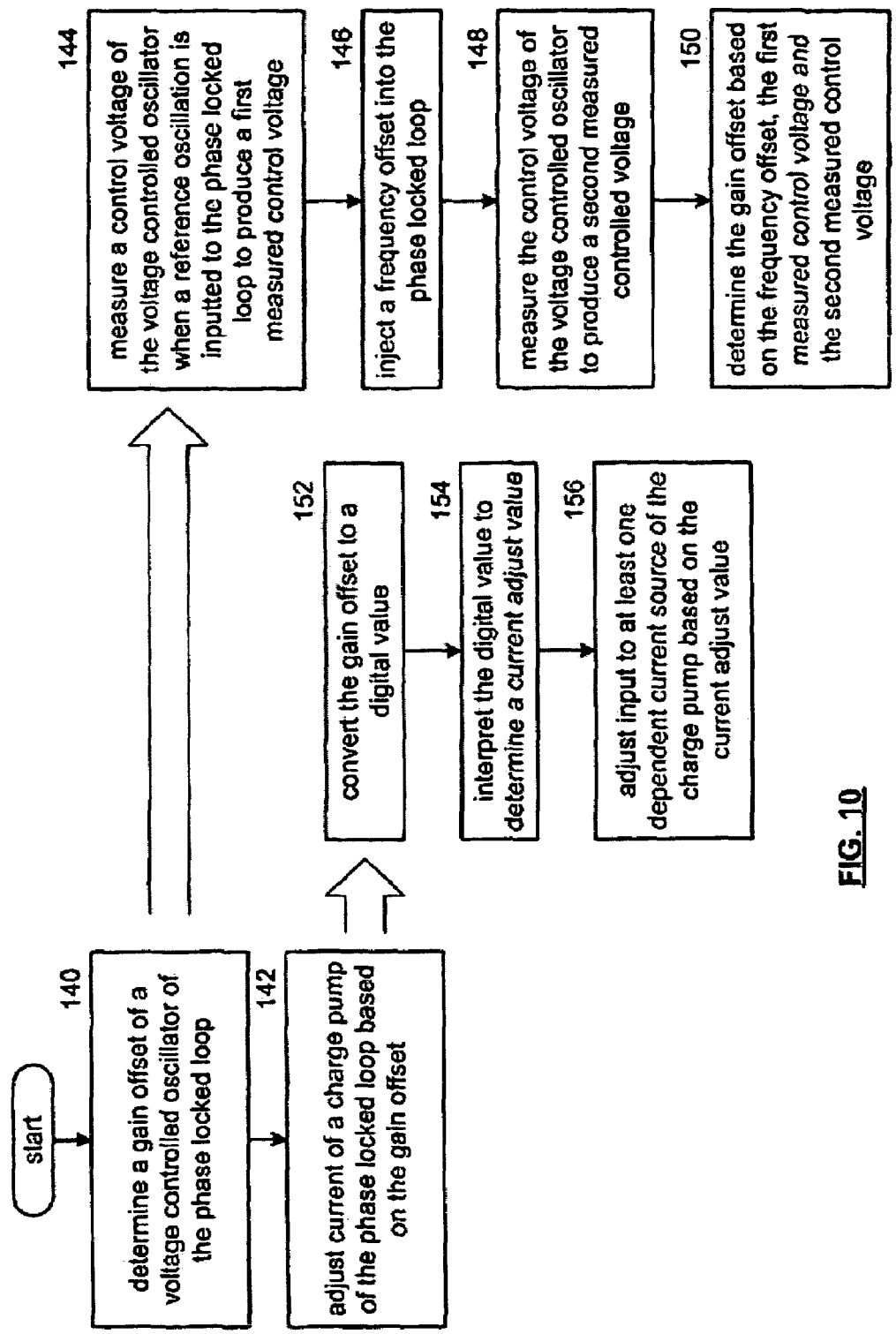
FIG. 10 is a logic diagram illustrating an example method for calibrating a PLL.

FIG. 10 is a logic diagram of method for calibrating a PLL. The process begins at step 140, where a gain offset of a VCO of the PLL is determined. The gain offset may be determined in the fashion discussed above, such as shown in steps 144-150 of FIG. 10, which will be discussed below. The process then proceeds to step 142 where the current of a charge pump of the PLL is adjusted based on the gain offset. This may be done in the fashion described above and as is illustrated in steps 152-156 of FIG. 10, which will be described below. It is noted that prior to step 140, or as part thereof, an open loop calibration of the VCO and calibration of an ADC included in a calibration module of the PLL may be performed.

At step 144 a first control voltage, of the VCO is measured when a reference oscillation is inputted to the phase locked loop. The VCO may then be coarse tuned, as discussed above, such as by adjusting the capacitance of the VCO, for example. The method of FIG. 10 then proceeds to step 146 where a frequency offset is injected into the PLL. The example method continues at step 148 where a second control voltage of the VCO is measured. The example method continues at step 150 where the gain offset is determined based on the frequency offset, the first control voltage and the second control voltage. The steps 144-150 may further comprise waiting for expiration of a settling period after injecting the reference oscillation and the frequency offset before measuring the first and second control voltages.

The processing steps of 144-150 may also be further expanded by injecting a second frequency offset into the PLL; measuring a third control voltage of the VCO, which may be done after the expiration of a settling period; and determining the gain offset based on the first frequency offset, the second frequency offset, the first control voltage, the second control voltage, and the third control voltage, such as discussed above.

At step 152, adjusting of the current signal of the charge pump begins by converting the gain offset to a digital value. The processing continues at step 154 where the digital value is interpreted to determine a current adjust value. The processing then continues at step 156 where the input to at least one dependent current source of the charge pump is adjusted based on the current adjust value.

While a number of aspects and embodiments have been discussed above, it will be appreciated that various modifications, permutations, additions and/or sub-combinations of these aspects and embodiments are possible. It is therefore intended that the following appended claims and claims hereafter introduced are interpreted to include all such modifications, permutations, additions and/or sub-combinations as are within their true spirit and scope.

We claim:

1. A method for calibrating a phase locked loop (PLL), the method comprising:

performing an open loop calibration of a voltage controlled oscillator (VCO), wherein the open loop calibration tunes the output oscillation frequency of the VCO within a predetermined range of frequencies;

determining a voltage offset and a gain error of an analog to digital converter (ADC) coupled with the PLL;

determining a gain offset of the open loop calibrated VCO using the determined voltage offset and the determined gain error of the ADC; and adjusting an output signal of a charge pump of the PLL based on the determined gain offset.

2. The method of claim 1, wherein the ADC is a differential ADC, the ADC is selectively coupled with the PLL, and wherein determining the voltage offset of the ADC comprises:

shorting a first input terminal of the ADC to a second input terminal of the ADC;

measuring a differential output signal of the ADC; and determining the voltage offset of the ADC based on the measured differential output signal.

3. The method of claim 1, wherein the ADC is a differential ADC, the ADC is selectively coupled with the PLL, and wherein determining the gain error comprises:
applying a reference voltage across a first input terminal and a second input terminal of the ADC;
measuring a differential output signal of the ADC; and
determining the gain error of the ADC based on the measured differential output signal and the reference voltage.

4. The method of claim 3, further comprising providing the reference voltage from a band gap reference circuit.

5. The method of claim 1, wherein determining the gain offset further comprises:
using the voltage offset and the gain error of the ADC, measuring a first control voltage of the VCO while providing a reference oscillation to the PLL;
injecting a first frequency offset into the PLL;
using the voltage offset and the gain error of the ADC, measuring a second control voltage of the voltage controlled oscillator; and
determining the gain offset based on the frequency offset, the first control voltage, and the second control voltage.

6. The method of claim 5, further comprising:
injecting a second frequency offset into the phase locked loop;
using the voltage offset and the gain error of the ADC, measuring a third control voltage of the voltage controlled oscillator; and
determining the gain offset based on the first frequency offset, the second frequency offset, the first control voltage, the second control voltage, and the third control voltage.

7. The method of claim 6, further comprising:
waiting for expiration of a first settling period after injecting the first frequency offset before measuring the second control voltage; and
waiting for expiration of a second settling period after injecting the second frequency offset before measuring the third control voltage.

8. The method of claim 1, wherein adjusting the output signal of the charge pump comprises:
converting the gain offset to a digital value;
determining a current adjust value based on the digital value; and
adjusting an input signal to at least one dependent current source of the charge pump based on the current adjust value.

9. A phase locked loop (PLL) adapted for auto-calibration, the PLL comprising:
a phase and frequency detection module adapted to:
produce an up signal when at least one of a phase and a frequency of a reference oscillation leads at least one of a phase and a frequency of a feedback oscillation; and
produce a down signal when the at least one of the phase and the frequency of the feedback oscillation leads the at least one of the phase and the frequency of the reference oscillation;
a charge pump circuit adapted to:
receive the up signal and the down signal; and
provide a charge pump signal in response to the received up signal or down signal;
a loop filter adapted to:
receive the charge pump signal; and
provide a control voltage in response to the received charge pump signal;
a voltage controlled oscillator (VCO) adapted to:
receive the control voltage; and
provide an output oscillation signal in response to the received control voltage; and
a calibration module adapted to:
perform an open loop calibration of the VCO during which the frequency of the output oscillation signal from the VCO is tuned within a predetermined range of frequencies;
determine a voltage offset and a gain error of an analog to digital converter (ADC) included in the calibration module, the ADC being coupled with the PLL;
determine a gain offset of the open loop calibrated VCO using the voltage offset and the gain error of the ADC; and
adjust the charge pump signal based on the determined gain offset.

10. The PLL of claim 9, wherein the ADC is a differential ADC having a first input terminal, a second input terminal, and an output terminal, and wherein the ADC is adapted such that the voltage offset of the ADC can be determined by:
shorting the first input terminal of the ADC to the second input terminal of the ADC;
measuring a differential output signal at the output terminal of the ADC; and
determining the voltage offset of the ADC based on the measured differential output signal.

11. The PLL of claim 9, wherein the ADC is a differential ADC having a first input terminal, and a second input terminal, and an output terminal, and wherein the ADC is adapted such that the gain error of the ADC is determined by:
applying a reference voltage across the first input terminal and the second input terminal of the ADC;
measuring a differential output signal at the output terminal of the ADC; and
determining the gain error of the ADC from the measured differential output signal and the reference voltage.

12. The PLL of claim 11, wherein the PLL is adapted to receive the reference voltage provided from a band gap reference circuit.

13. The PLL of claim 9, wherein the calibration module is further adapted to determine the gain offset by:
using the voltage offset and the gain error of the ADC, measuring a first control voltage of the VCO while providing a reference oscillation to the PLL;
injecting a first frequency offset into the PLL;
using the voltage offset and the gain error of the ADC; measuring a second control voltage of the VCO; and
determining the gain offset based on the first frequency offset, the first control voltage and the second control voltage.

14. The PLL of claim 13, wherein the calibration module is further adapted to determine the gain offset by:
injecting a second frequency offset into the PLL;
using the voltage offset and the gain error, measuring a third control voltage of the VCO; and
determining the gain offset based on the first frequency offset, the second frequency offset, the first control voltage, the second measured voltage, and the third control voltage.

15. The PLL of claim 14, wherein the calibration module further comprises delay circuitry adapted to:
wait for expiration of a first settling period after injecting the first frequency offset before measuring the second control voltage; and wait for expiration of a second settling period after injecting the second frequency offset before measuring the third control voltage.

16. The PLL of claim 9, wherein the calibration module is further adapted to modify a capacitance of the VCO to tune the frequency of the output oscillation signal of the VCO within a predetermined range of frequencies.

17. The PLL of claim 9, wherein the calibration module is further adapted to adjust one or more of at least one dependent current source of the charge pump by:
converting the gain offset to a digital value;
determining a current adjust value based on the digital value; and
adjusting respective input signals to the one or more of the at least one dependent current source based on the current adjust value.

18. The PLL of claim 9, wherein the reference oscillation comprises at least one of a frequency shift keying modulated signal; a phase shift keying modulated signal; and a M shift keying modulated signal.

19. A radio transmitter comprising:
a phase and frequency detection module adapted to:
produce an up signal when at least one of a phase and a frequency of an input modulated signal leads at least one of a phase and a frequency of a feedback oscillation; and
produce a down signal when the at least one of the phase and the frequency of the feedback oscillation leads the at least one of the phase and the frequency of the input modulated signal;
a charge pump circuit adapted to:
receive the up signal and the down signal; and
provide a charge pump signal in response to the received up or down signal;
a loop filter adapted to:
receive the charge pump signal; and
provide a control voltage in response to the received charge pump signal;
a voltage controlled oscillator (VCO) adapted to:
receive the control voltage; and
provide an output radio frequency oscillation signal in response to the received control voltage, wherein the feedback oscillation is derived from the radio frequency oscillation signal; and
a calibration module adapted to:
perform an open loop calibration of the VCO during which, the frequency of the output oscillation signal from the VCO is tuned within a predetermined range of frequencies;
determine a voltage offset and a gain error of an analog to digital converter (ADC) included in the calibration module, the ADC being selectively coupled with the PLL;
determine a gain offset of the open loop calibrated VCO using the ADC, the voltage offset and the gain error; and
adjust at least one dependent current source of the charge pump circuit based on the determined gain offset.

20. The radio transmitter of claim 19, wherein the calibration module is further adapted to determine the gain offset by:
using the voltage offset and the gain error of the ADC, measuring a first control voltage of the VCO while providing a reference oscillation to the PLL;
injecting a first frequency offset into the PLL;
waiting for expiration of a first settling period;
after expiration of the first settling period, measuring; using the voltage offset and the gain error of the ADC, measuring a second control voltage of the voltage controlled oscillator;
injecting a second frequency offset into the phase locked loop;
waiting for expiration of a second settling period;
after expiration of the second settling period, using the voltage offset and the gain error of the ADC, measuring a third control voltage of the voltage controlled oscillator; and
determining the gain offset based on the first frequency offset, the second frequency offset, the first control voltage, the second control voltage, and the third control voltage.

* * * * *